(12) United States Patent
Best

(10) Patent No.: US 7,198,197 B2
(45) Date of Patent: Apr. 3, 2007

(54) METHOD AND APPARATUS FOR DATA ACQUISITION

(75) Inventor: Scott Best, Palo Alto, CA (US)

(73) Assignee: Rambus, Inc., Los Altos, CA (US)

( * ) Notice: Subject to any disclaimer, the term of this patent is extended or adjusted under 35 U.S.C. 154(b) by 412 days.

(21) Appl. No.: 10/288,629

(22) Filed: Nov. 5, 2002

(65) Prior Publication Data

US 2004/0084537 A1    May 6, 2004

(51) Int. Cl.
G06K 19/06    (2006.01)

(52) U.S. Cl. .................................................. 235/492

(58) Field of Classification Search ............... 235/492, 235/474; 365/233, 189.05, 219, 194, 236
See application file for complete search history.

(56) References Cited

U.S. PATENT DOCUMENTS

| | | | | |
|---|---|---|---|---|
| 5,060,239 A | * | 10/1991 | Briscoe et al. ............... 375/260 |
| 5,185,736 A | * | 2/1993 | Tyrrell et al. ................ 370/358 |
| 5,272,627 A | * | 12/1993 | Maschhoff et al. ............ 378/4 |
| 5,368,041 A | * | 11/1994 | Shambroom ................ 600/544 |
| 5,509,034 A | * | 4/1996 | Beukema .................... 375/344 |
| 5,526,286 A | * | 6/1996 | Sauerwein et al. ........... 702/79 |
| 5,675,584 A | * | 10/1997 | Jeong .......................... 375/220 |
| 5,748,686 A | * | 5/1998 | Langberg et al. ............ 375/367 |
| 5,805,619 A | * | 9/1998 | Gardner et al. .............. 375/376 |
| 5,965,819 A | * | 10/1999 | Piety et al. .................... 73/660 |
| 6,401,213 B1 | | 6/2002 | Jeddeloh ...................... 713/401 |
| 6,667,894 B2 | * | 12/2003 | Arnoux et al. ................ 365/45 |
| 6,728,162 B2 | * | 4/2004 | Lee et al. .................... 365/233 |
| 6,735,710 B1 | * | 5/2004 | Yoshikawa .................. 713/500 |
| 6,782,404 B2 | * | 8/2004 | Choudhary ................. 708/300 |
| 6,789,219 B2 | * | 9/2004 | Hapke et al. ................ 714/732 |
| 2002/0122348 A1 | | 9/2002 | Lee et al. .................... 365/233 |
| 2003/0091136 A1 | * | 5/2003 | Sugita ......................... 375/355 |

FOREIGN PATENT DOCUMENTS

EP    1 028 42 9 A2    8/2000
WO    WO 02 1 59 5 A2    2/2002

OTHER PUBLICATIONS

Sidiropoulos et al., "SA 20.2: A Semi-Digital DLL with Unlimited Phase Shift Capability and 0.08-400MHz Operating Range," IEEE International Solid-State Circuits Conference, 332-333, 1997.
Yang et al., "FP 12.4: A 0.8µm CMOS 2.5Gb/s Oversampled Receiver for Serial Links," IEEE International Solid-State Circuits Conference, 1996.

* cited by examiner

*Primary Examiner*—Uyen-Chau N. Le
(74) *Attorney, Agent, or Firm*—McDonnell Boehnen Hulbert & Berghoff LLP

(57) ABSTRACT

Systems and methods are shown for reading data. One method includes receiving at a first circuit, from a second circuit, a plurality of data input signals and a timing reference signal, generating a plurality of oversampled data input signal and an oversampled timing reference signal, and determining a bit boundary range in the oversampled timing reference signal. The bit boundary range is then applied to the oversampled data input signals to determine a plurality of data words from the plurality of oversampled data input signals.

52 Claims, 10 Drawing Sheets

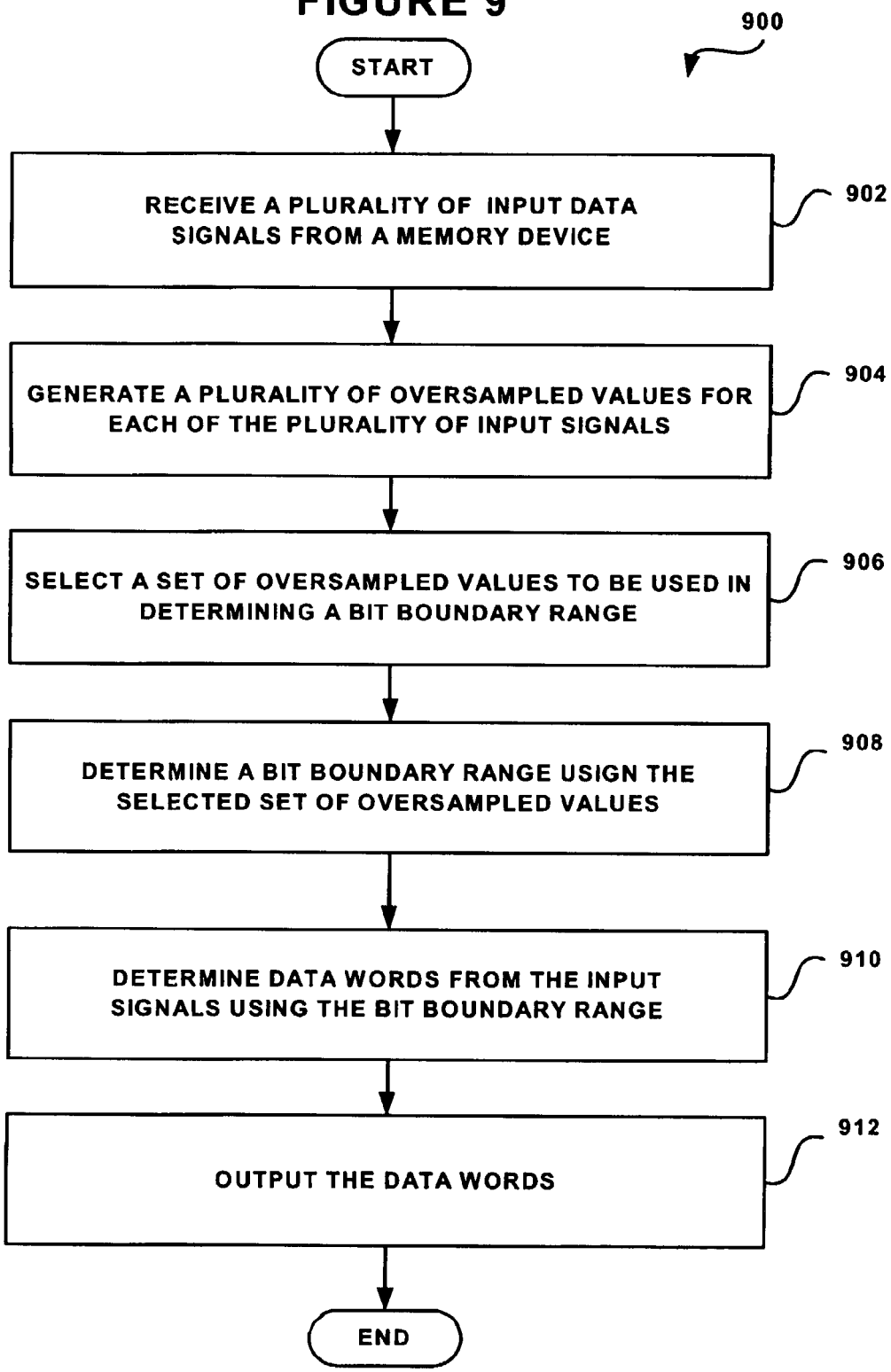

_US 7,198,197 B2_

METHOD AND APPARATUS FOR DATA ACQUISITION

FIELD OF THE INVENTION

The present invention relates generally to the field of chip-to-chip and intra-chip communication systems. More particularly, the present invention relates to a method and apparatus for data acquisition in an electronic system.

BACKGROUND OF THE INVENTION

Computer systems generally include a memory subsystem that contains memory devices where instructions and data are held for use by a processor of the computer system. Because the processor is typically capable of operating at a higher rate than the memory subsystem, the operational speed of the memory subsystem has a significant impact on the performance of the computer system.

In the past, the memory devices making up the memory subsystem, such as Dynamic Random Access Memory ("DRAM") devices, were typically asynchronous devices, i.e., the memory devices stored or output data in response to control signals from a processor. However, asynchronous operation results in a delay between the time that a control signal, e.g., a read command and address value, is received by the memory device and the time that the device responds, e.g., the data becomes available at the output of the memory device. This delay between the reception of a control signal and the device's response typically lasts for several operational cycles of the processor and, during the delay, the processor is typically unable to perform useful functions, and the operational cycles are consequently wasted.

To avoid wasting operational cycles while waiting for a response from memory, synchronous memory devices, such as synchronous DRAM ("SDRAM") devices, have been developed. SDRAM devices exploit the fact that most memory accesses are sequential and are designed to fetch data words in a burst as fast as possible. SDRAM devices typically operate by outputting a sequence, or "burst", of several words or bytes of data in response to a single control signal from the processor. For example, a burst cycle, such as 5-1-1-1, consists of a sequence of four data word transfers where only the address of the first word is supplied via the address bus input to the memory device. The 5-1-1-1 refers to the number of clock cycles required for each word of the burst. In this example, the first word is available at the output of the SDRAM device at five clock cycles after the input cycle of the command signal, and another word is output by the memory device at each subsequent rising edge of the clock to complete the burst.

Another approach that has been developed to improve memory performance is called double data-rate ("DDR") and is used in DDR DRAM memory devices. In a DDR DRAM device, data during a burst is output on both the rising and falling edge of the clock cycles, which effectively doubles the rate of operational bandwidth of the memory subsystem.

FIG. 1 is a functional block diagram of a memory architecture 10 that illustrates an example of a DDR memory controller 20 according to the conventional art. Memory controller 20 contains a clock generation circuit 22 that generates a clock signal CLK0. The CLK0 drives even clock domain registers 24 and 25, and odd domain registers 26 and 27. The CLK0 signal is also coupled to a DDR DRAM block 90 and arrives at the clock input ("CLK") of the DDR DRAM device 90 after a propagation delay time interval $t_{PD}$, as represented in FIG. 1 by block 92.

DDR DRAM device 90, in turn, generates a data output signal at output DQ after an output to clock delay interval $t_{DQC}$, which experiences another propagation delay $t_{PD}$ represented by block 94, and which results in a delayed data signal DQ1 arriving at the memory controller 20. After a clock to output delay interval $t_{DQCK}$, DDR DRAM device 90 also outputs a data output synchronize signal DQS, also known as a data strobe signal, that is also delayed by propagation delay time $t_{PD}$, as represented by block 96, and results in a delayed version of the DQS signal called DQS1 that is received by the controller 20. It should be noted that the propagation delays represented by blocks 92, 94 and 96 are not necessarily equal.

The DQ1 and DQS1 signals are received by a DQS domain circuit 70 of the controller 20. The DQ1 signal is input to edge-triggered data samplers 74 and 76. The DQS1 signal enters $t_1$ delay circuit 72, which results in a delayed signal DQS2. The rising edge of the DQS2 signal activates the sampling capability of the edge-triggered data sampler 74, and a falling edge of the DQS2 signal activates the sampling capability of the edge-triggered data sampler 76, which latches even and odd data words, respectively, of the DQ1 signal.

After a data valid time interval $t_V$, edge-triggered data sampler 74 generates data signal DQ2 which is input to even clock domain register 24, which is then clocked on a rising edge of the CLK0 signal generated by clock generation circuit 22. Also, after data valid interval $t_v$, edge-triggered data sampler 76 outputs a delay data signal DQ3 to odd clock domain register 26, which is clocked on the falling edge of the CLK0 signal.

DDR memory controller 20 illustrated in FIG. 1 works well in low-speed memory systems operating at rates of 133 MHz or slower. In high-speed source synchronous memory systems, i.e., systems that use a strobe or clock signal generated by the address/data signal source to latch or clock the address/data signal at the receiving agent, data being read from specific memory device and any accompanying DQS signals arrives at a memory controller with some timing offset, relative to a system clock. These small timing offsets become performance limiting factors in high-speed memory systems.

Memory controllers therefore commonly employ delay-locked loops ("DLLs") to correct phase offsets in DRAM devices or point-to-point DDR memory systems since such systems have well-managed (fixed or known) timing offsets. However, as is known in the art, DDR memory devices are also used in a multi-rank memory system, in which one or more memory devices share the same memory channel. During a read operation of the conventional device shown in FIG. 1, a DDR memory device transmits N data (DQ) signals (typically 8 or 32) back to the controller 20, accompanied by a strobe (DQS) signal, which is edge-aligned with the data signal. Although these DQ/DQS signals emerge from a DDR DRAM device in close proximity to an incoming global clock (CLK), by the time they reach the controller, they arrive in some arbitrary phase relationship relative to the CLK. This arbitrary phase relationship creates problems in a multi-rank DDR system. In a multi-rank system, during a read operation, the DQ/DQS signals arrive at the controller at different phases relative to the CLK, depending on which device in the rank transmitted the data. Therefore, it is very difficult to use a single clock signal, e.g., a clock derived from the CLK by a DLL, to sample all data regardless of the data's origin.

Therefore, it is desirable to provide an improved circuit topology and method for data acquisition in multi-rank memory systems.

SUMMARY OF THE INVENTION

In accordance with a first aspect of the present invention, a method for data acquisition is provided. The method includes receiving a plurality of input signals, generating a series of oversampled input signals for each of the received input signals, and selecting one of the series, wherein the selected series has at least one bit transition. The method further includes determining a bit boundary range using the selected series, and determining a plurality of data words using the bit boundary range, wherein each of the data words corresponds to one of the plurality of input signals. The present invention may be used for both chip-to-chip and intra-chip communication.

In accordance with a second aspect of the present invention, a first electronic circuit for reading data from a second electronic circuit is provided. The first electronic circuit includes an input sampler circuit configured to receive a plurality of input signals from the second electronic circuit, generate a plurality of oversampled input signals and output the plurality of oversampled input signals. The first electronic circuit further includes a data recovery circuit configured to receive the plurality of oversampled input signals. According to one embodiment, the data recovery circuit includes a bit transition detection circuit configured to determine a bit boundary range using one of the plurality of oversampled input signals based on signal logic state transition positions in the selected oversampled input signal. The first electronic circuit further includes a data extraction circuit configured to receive the bit boundary range from the bit transition detection circuit, and further receive the plurality of oversampled input signals, wherein the data extraction circuit then determines data words from the plurality of oversampled input signals using the bit boundary range. In one embodiment of the present invention, the first electronic circuit is a memory controller and the second electronic circuit is a memory device.

These as well as other aspects and advantages of the present invention will become more apparent to those of ordinary skill in the art by reading the following detailed description, with reference to the accompanying drawings.

BRIEF DESCRIPTION OF THE DRAWINGS

Exemplary embodiments of the present invention are described with reference to the following drawings, in which:

FIG. 9 is a control flow diagram illustrating an embodiment of the function performed by a controller to recover data from a memory device according to the present invention.

DETAILED DESCRIPTION

The present invention relates to data acquisition using oversampling techniques. Such techniques may be employed, for example, in chip-to-chip communication systems, including for example in memory systems. Such techniques may also be used in intra-chip communications. A variety of embodiments will be described hereinafter in reference to DDR memory systems; however, it should be understood that the present invention is not limited to DDR memory systems, and the methods and systems described hereinafter could be equally applicable to other chip-to-chip or intra-chip communication systems, including for example, other source synchronous memory systems such as RDRAM®, FCDRAM, or SDRAM, systems.

Figure 1:
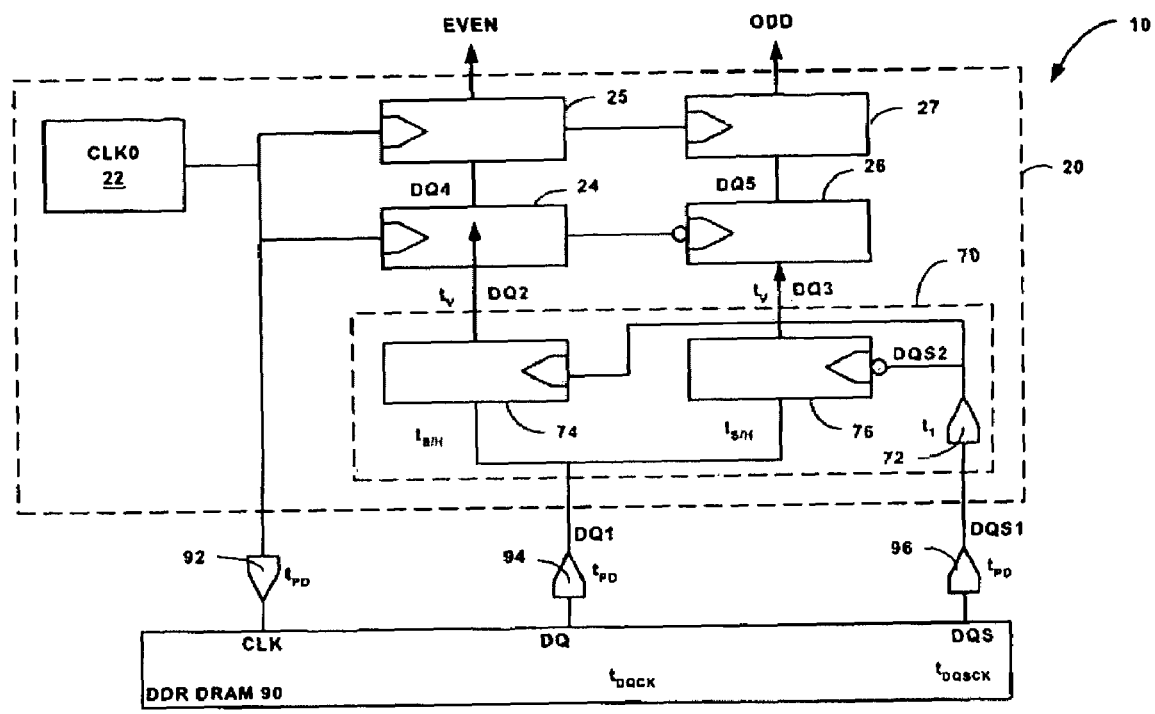
FIG. 1 is a simplified functional block diagram illustrating an example of a conventional memory controller for a synchronous memory device.
Figure 2A:
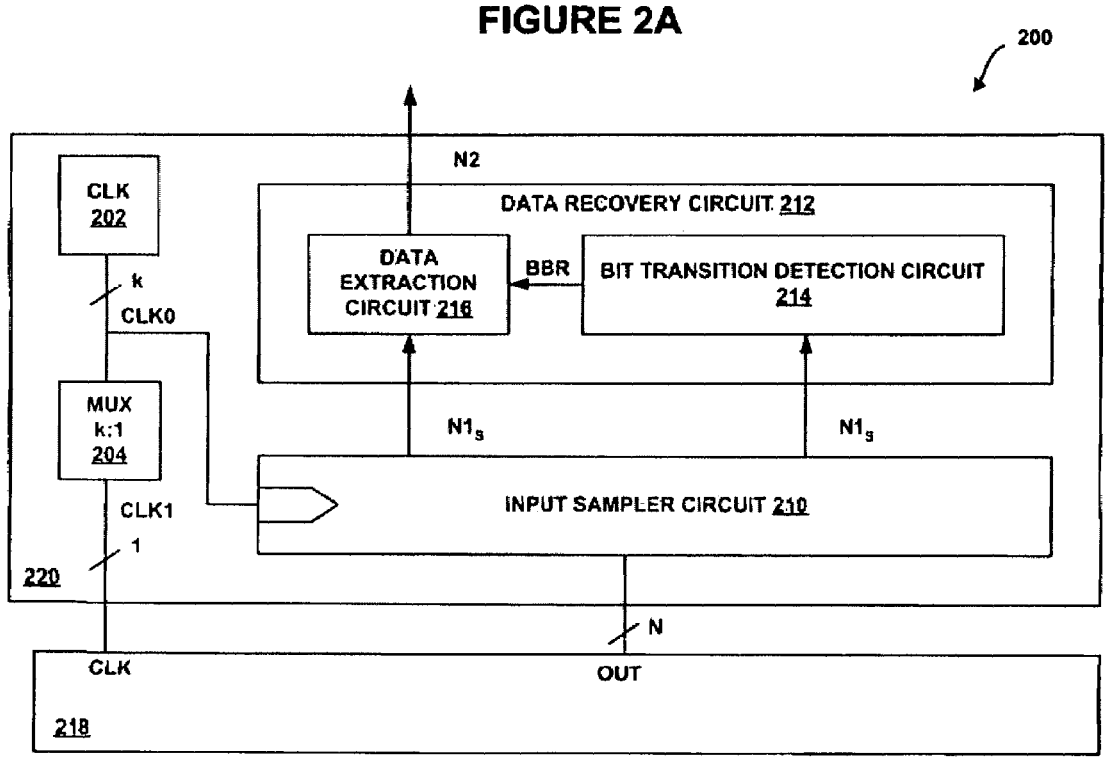
FIG. 2A is a simplified functional block diagram illustrating an example of a chip-to-chip communication system according to the present invention.

FIG. 2A is a functional block diagram of an exemplary system 200 for data acquisition according to one embodiment of the present invention. The system 200 includes a first circuit element 218 and a second circuit element 220. According to exemplary embodiments, the circuit elements 218 and 220 may include a first electronic circuit and a second electronic circuit located on a single chip including a plurality of electronic circuits. Alternatively, the circuit elements 218 and 220 may be placed on two different chips that are placed on a single board or different boards.

The second circuit element 220 includes a clock source 202 configured to supply a clock signal CLK0. According to an exemplary embodiment, clock source 202 may be a clock generation circuit that is configured to generate a set of incrementally phase offset clock signals, hereinafter referred to a multiphase clock signal CLK0. It should be understood that the clock generation circuit 202 may an on-chip clock generation source or an off-chip clock generation source. According to an exemplary embodiment, the multiphase clock signal CLK0 generated on the clock generation circuit 202 may include "k" phase offset clock signals. The clock generation circuit 202 supplies a CLK1 signal to the first circuit element 218. As illustrated in FIG. 2A, the CLK1 signal is selected from the "k" CLK0 signals by a multiplexor ("MUX") 204. Although the value of "k" may be any integer greater than or equal to 2, in some embodiments, the value of "k" is preferably equal to any power of 2, such as 4, 8, 16, etc.

The first circuit element 218 generates N1 input data signals that are input to the second circuit element 220 via an output OUT. As illustrated in FIG. 2A, the second circuit element 220 includes an input sampler circuit 210, and a data recover circuit 212 including a data extraction circuit 216 and a bit transition detection circuit 214. The input sampler circuit 210 is driven by phase offset clock signals (CLK0) supplied by the clock generation circuit 202. According to one embodiment, the input sampler circuit 210 may include one or more edge-triggered data samplers. However, different embodiments are possible as well.

The input sampler circuit 210 uses "k" phase offset clock signals to generate oversampled input values, designated "$N1_s$" in FIG. 2, that are subsequently passed to the bit transition detection circuit 214 and the data extraction circuit 216. The input sampler circuit 210 outputs k oversampled $N1_s$, values for each of the N input data signals N1. For example, if the first circuit element 218 outputs eight N1 input signals (because, in this example N=8), and k=8, then the input sampler circuit 210 will output k*N or 64 oversampled $N1_s$ values. Eight for each of the input signals.

According to an exemplary embodiment, the bit transition detection circuit 214 uses a set of eight $N1_s$ values corresponding to one of the input signals to detect logical state bit transitions in the selected $N1_s$ values. For example, the bit transition detection circuit 214 may be programmed with one or more algorithms for determining bit transitions in the selected set of oversampled $N1_s$ values corresponding to one of the input signals N1.

Further, the bit transition detection circuit 214 determines a bit boundary range based on positions of logical state bit transitions detected in the selected oversampled values. The bit transition detection circuit 214 may then provide the determined bit boundary range to the data extraction circuit 216. The data extraction circuit 216 may then use the bit boundary range to recover data from the oversampled values corresponding to each input signal N1 that was output from the first circuit element 218.

Figure 2B:
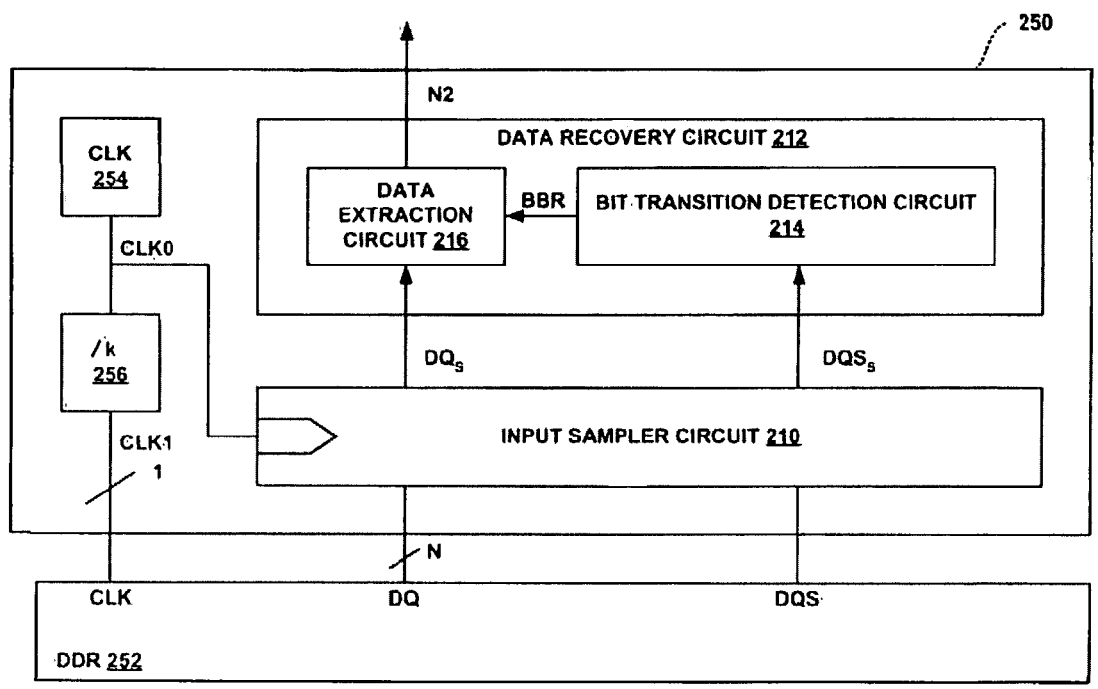
FIG. 2B is a simplified functional block diagram illustrating an example of a memory controller for a memory device according to the present invention.

FIG. 2B is a functional block diagram of an exemplary memory controller 250 coupled to a memory device 252. Memory controller 250 may be used for data recovery according to one embodiment of the present invention. The memory controller 250 illustrated in FIG. 2B is a DDR memory controller. However, the memory controller 250 could also be used for different memory devices as well. Further, it should be understood that even though only one memory device 252 is illustrated in FIG. 2B, the memory device 252 may be a first memory device in a memory system having multiple memory devices.

The memory controller 250 contains a clock source 254 which is used to provide a CLK0 signal. According to an exemplary embodiment clock source 254 may be a clock generation circuit 254 that is configured to generate the CLK0 signal. According to another exemplary embodiment, the clock generation circuit 254 may be a high-speed, low-jitter clock source that generates a high-speed clock signal CLK0. It should be understood that the clock generation circuit 254 may be an "on-chip" clock generation source or an "off-chip" clock generation source. If an "on-chip" clock generation circuit is used, the circuit 254 may employ a phase-locked loop ("PLL") with an "off-chip" signal used as a reference. In such an embodiment, the PLL may multiply the clock frequency of the reference signal to obtain a desired high-frequency clock signal. However, it should be understood that alternative clock sources could also be used, such as the clock source 202 described in reference to FIG. 2A that generates a multiphase clock signal.

Clock generation circuit 254 further supplies a CLK1 signal to the DDR memory device 252. As illustrated in FIG. 2B, the CLK1 signal is derived from the CLK0 signal by a divider 256 that divides the high-speed clock signal CLK0 to generate a lower-frequency clock signal CLK1 that is then output to the DDR memory device 252. Preferably, the divider 256 divides the frequency of the high-speed clock signal by an integer k.

During a read operation, DDR memory device 252 generates N input data signals that are input to the memory controller 250 via an output DQ. Although N can equal any integer having a value greater than zero, in an exemplary embodiment N equals 8 or 32. It should be understood that the N DQ data signals arriving at the memory controller 250 may experience some propagation delay from the time the signals are output from the DDR memory device 252 to the time they are input into the memory controller 250. In addition to the DQ signals, the DDR memory device 252 also outputs a data output synchronize signal DQS (a strobe signal) that may also experience some delay before it reaches the memory controller 250.

As illustrated in FIG. 2B, an input sampler circuit 210 receives the DQ and DQS signals from the DDR memory device 252. The input sampler circuit 210 in FIG. 2B is a rising-edge dependent circuit that is driven by the high-speed clock signal CLK0. It should be understood that the input sampler circuit 210 is not limited to being a rising-edge dependent circuit. Input sampler circuit 210 may be a rising-edge and/or a falling-edge dependent circuit. In an alternative embodiment, input sampler circuit 210 comprises a first input sampler circuit which is response to a rising edge and a second input sampler circuit which is falling edge triggered. According to an exemplary embodiment, input sampler circuit 210 may include one or more edge-triggered data samplers that generate a single output for every rising edge of the clock signal CLK0.

The input sampler circuit 210 generates oversampled DQ and DQS values, designated $DQ_s$ and $DQS_s$ respectively, that are subsequently passed to a data recovery circuit 212. It should be understood that, if N=8, such that the DDR memory device 208 provides eight DQ signals accompanied by one DQS signal, and if an oversampling rate k=8 such that the oversampling rate is "kx", the input sampler circuit 210 outputs eight oversampled $DQ_s$ values for each of the eight DQ signals input from DDR device 252. Additionally, the input sampler circuit 210 provides eight oversampled $DQS_s$ values for the DQS signal input from the DDR 252. Therefore, for example, if an oversampling rate is 8×, the input sampler circuit 210 generates, during every clock cycle, an 8-bit deep by 9-bit long "matrix" of data (for 8 DQ signals and 1 DQS signal).

In the exemplary embodiment described in the preceding paragraph, the values of N and k are equal. However, it should be understood that the values of N and k could also be different. For instance, k may be equal to any integer value greater than or equal to two and N may be equal to any integer value greater than zero. According to an exemplary embodiments however, k will be equal to a power of 2, such as 2, 4, 8, 16, etc., and N will be equal to 8, 16, or 32. During every clock cycle, input sampler circuit 210 generates a k bit deep by (N+1) bit long matrix of data (for N DQ signals and 1 DQS signal). For instance, if k=4 and N=8, the input sampler circuit 210 generates, during every clock cycle, a 4-bit deep by 9-bit long matrix of data (for 8 DQ signals and 1 DQS signal).

The data recovery circuit 212 includes a bit transition detection circuit 214 and a data extraction circuit 216. According to an exemplary embodiment, the data recovery circuit 212 uses the $DQS_s$ signal as a presence detection signal rather than a timing synchronization signal (which is a typical use of the DQS signal in the prior art systems). In such an embodiment, the bit transition detection circuit 214 detects logical state bit transition positions in the oversampled $DQS_s$ signal. For example, the bit transition detection circuit 214 may be preprogrammed with one or more algorithms for determining bit transitions in the oversampled $DQS_s$ signal. In one embodiment, the bit transition detection circuit 214 may determine bit transitions in the $DQS_s$ signal by exclusive-ORing ("XOR") each sample with the adjacent sample in a series of $DQS_s$ samples. In such an embodiment, an output (i) from the XOR logic is high if the transition happened just before the $DQS_s$ sample (i).

Further, according to an exemplary embodiment, the bit transition detection circuit 214 determines a bit boundary range ("BBR") based on the positions of the logical state bit transitions detected in the $DQS_s$ signal. For example, if the bit transition detection circuit 214 determines that the $DQS_s$ signal transitions at bit position 2 and bit position 6, the bit transition detection circuit 214 may set a bit boundary range from the bit position 3 to the bit position 5 (3:5). Then, the bit transition detection circuit 214 provides the bit boundary range to the data extraction circuit 216, as illustrated with "BBR" in FIG. 2B.

When the data extraction circuit 216 receives a bit boundary range from the bit transition detection circuit 214, the data extraction circuit 216 applies the received bit boundary range to recover data from each set of oversampled $DQ_s$ values corresponding to each DQ signal. According to an exemplary embodiment illustrated in FIG. 2B, the DDR device 252 generates two outputs per clock cycle, an even data word and an odd data word. In such an embodiment, the data extraction circuit 216 uses the bit boundary range to determine which of the oversampled input values are used to generate an even and odd data word, for each of the DQ inputs, that are output from the data recovery circuit 2121, as illustrated by "N2" in FIG. 2B.

Figure 3:
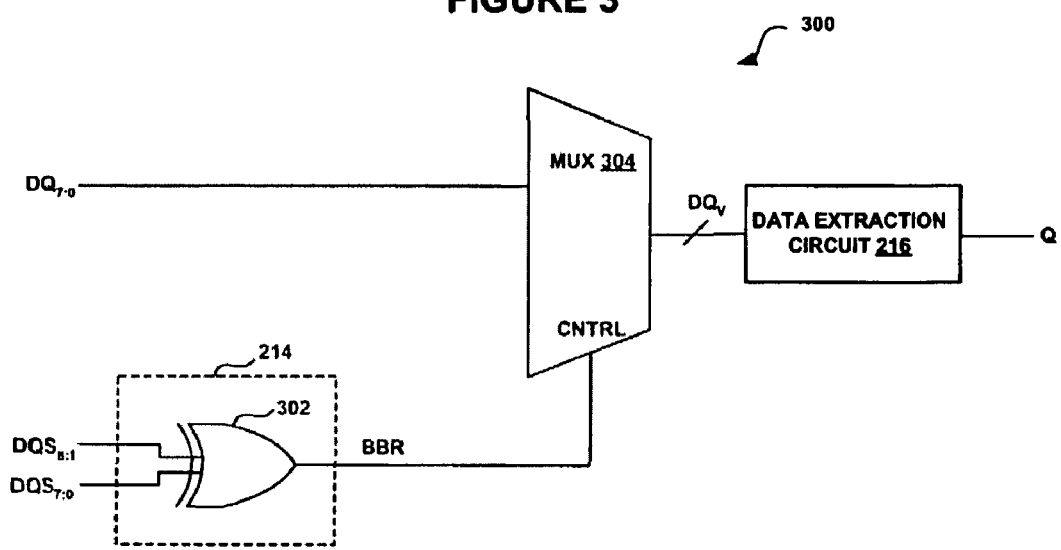
FIG. 3 is a simplified functional block diagram illustrating an example of a data recovery circuit illustrated in FIG. 2B.

FIG. 3 is a block diagram illustrating one embodiment of the data recovery circuit 212. As illustrated in FIGS. 2A and 2B, the data recovery circuit 212 includes the bit transition detection circuit 214 and the data extraction circuit 216. According to one exemplary embodiment illustrated in FIG. 3, the bit transition detection circuit 214 may be an XOR gate 302 that detects transitions in a series of $DQS_s$ samples. Specifically, the XOR gate 302 exclusive-ORs each sample with an adjacent sample. For example, if a DQS, signal is "01111000," the XOR gate 302 applies an XOR operation to the $DQS_s$ signal "01111000" (depicted as $DQS_{7-0}$ in FIG. 3) and a shifted version of the $DQS_s$ signal "00111100" (depicted as $DQS_{8:1}$ in FIG. 3), producing an output signal "01000100." Using the output of the XOR gate 302, the bit boundary range ("BBR") is determined to be 3:5.

The bit boundary range is then used to select $DQ_s$ bits, corresponding to each DQ signal, to be output by a multiplexor ("MUX") 304. According to an exemplary embodiment, the multiplexor 304 selects the bits of the $DQ_s$ signal using the BBR signal provided by the bit transition detection circuit 214. Thus, in the exemplary embodiment, the multiplexor 304 selects bits 3 through 5 of the $DQ_s$ signal. Multiplexor 304 provides bits 3 through 5 to the data extraction circuit 216. Using the selected bits, the data extraction circuit 216 recovers the value of DQ and outputs such value as output Q. Data extraction circuit 216 may, for example, be a data filter circuit which determines an output value Q by looking for sequential input bits having the same logical value. Table 1 illustrates an exemplary truth table that may be used by a data filter circuit. Alternatively, data extraction circuit 216 may, for example, be a voter circuit.

Table 2 illustrates an exemplary truth table that may be used for voting at the voter circuit. It should be understood that Tables 1 & 2 only illustrate exemplary embodiments, and different embodiments are possible as well. For example, the voter circuit is not limited to voting on three bits, illustrated as bits "a", "b", and "c" in Table 2 to generate a single output bit "Q".

TABLE 1

| Input Bits to the data filter circuit | | | | Output of the data filter circuit |
| --- | --- | --- | --- | --- |
| a | b | c | d | Q |
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 0 |
| 0 | 1 | 0 | 1 | 0 |
| 0 | 1 | 1 | 0 | 1 |
| 0 | 1 | 1 | 1 | 1 |
| 1 | 0 | 0 | 0 | 0 |
| 1 | 0 | 0 | 1 | 0 |
| 1 | 0 | 1 | 0 | 1 |
| 1 | 1 | 0 | 0 | 1 |
| 1 | 0 | 1 | 1 | 1 |
| 1 | 1 | 0 | 1 | 1 |
| 1 | 1 | 1 | 1 | 1 |
| 1 | 1 | 1 | 0 | 1 |
| 1 | 1 | 1 | 1 | 1 |

TABLE 2

| Input Bits to the voter circuit | | | Output of the voter circuit |
| --- | --- | --- | --- |
| a | b | c | Q |
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Figure 4:
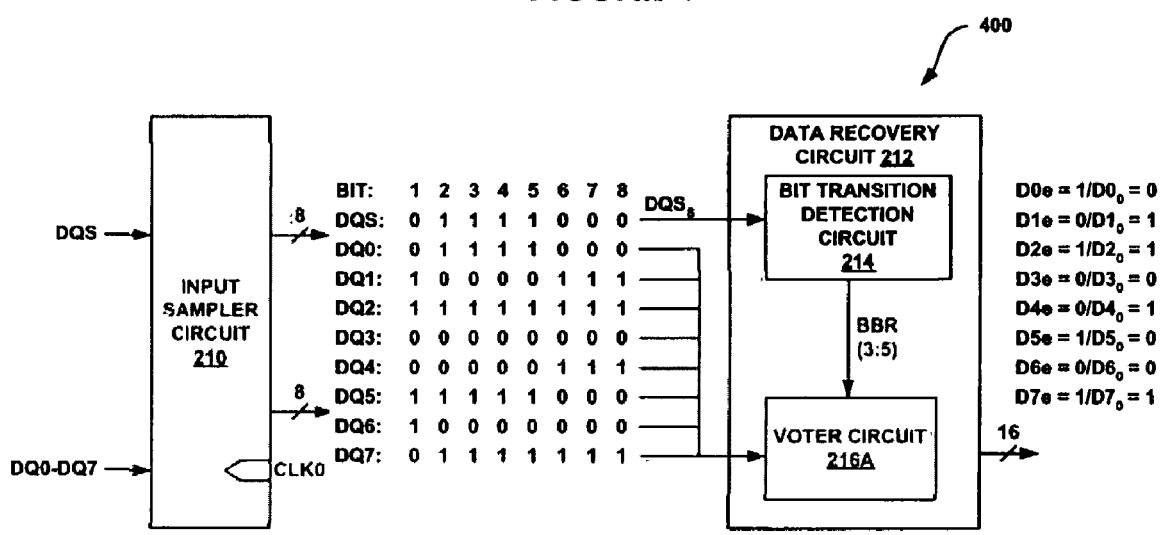
FIG. 4 is a simplified functional block diagram illustrating an exemplary process for recovering data from an exemplary set of data signals according to the present invention.

FIG. 4 is a block diagram illustrating one exemplary process for recovering data from an exemplary set of DQ signals that may be received at the memory controller 250 from a DDR memory device 252, as illustrated in FIG. 2B.

The input sampler circuit 210 receives eight data input signals ($DQ_0$–$DQ_7$) accompanied by a strobe signal (DQS) from the DDR memory device 252. The value of N is therefore 8. Next, as explained in reference to FIG. 2B, the input sampler circuit 210 generates a single output for every rising edge of the clock signal CLK0. Assuming a "kx" sampling rate, each such single output includes k bits for every DQ signal and k bits for the DQS signal. For example if the oversampling rate is 8x, the input sampler circuit 210 outputs eight bits for every DQ signal and eight bits for the DQS signal during every clock cycle of the CLK0 signal. FIG. 4 illustrates an exemplary 8-bit deep by 9-bit long "matrix" of data that is input to the data recovery circuit 212.

The bit transition detection circuit 214 detects the $DQS_s$ signal transitions at bit positions 2 and 6, i.e., "0" to "1" at bit position 2, and "1" to "0" at bit position 6. In one embodiment, the bit transition detection circuit 214 may then determine a bit boundary range and provide the bit boundary range to voter circuit 216A. The voter circuit 216A may then use the bit boundary range to recover data from the oversampled DQ signals. In the embodiment illustrated in FIG. 4, the bit boundary range is 3:5. Alternatively, instead of providing the bit boundary range, the bit transition detection circuit 214 may provide bit transition positions to the voter circuit 216A, and the voter circuit 216A may determine the bit boundary range using the bit transition positions.

The voter circuit 216A may then vote to determine even and odd data words for each DQ signal received from the DDR memory device 252 using the bit boundary range received from the bit transition circuit 214. For example, to determine an even data word ("$D0_e$") from the oversampled $DQ_0$ values, the voter circuit 216A votes on bits of the $DQ_0$ signal starting at the bit position 3 through the bit position 5. Referring to FIG. 4, the bit sequence in the bit boundary range 3:5 in the $DQ_0$ signal is "111", and the voter circuit 216A taking a vote on those bits may determine that the corresponding output even data word is "1". The voter circuit 216A uses the same method to determine the remaining even data words ($D1_e$–$D7_e$) corresponding to the oversampled DQ signal ($DQ_1$–$DQ_7$). The recovered data words corresponding to even data words are: $D0_e$=1, $D1_e$=0, $D2_e$=1, $D3_e$=0, $D4_e$=0, $D5_e$=1, $D6_e$=0, and $D7_e$=1, as illustrated in FIG. 4.

Similarly, to determine odd data words for each DQ signal received from the DDR memory device 252, the voter circuit 216A votes on bits 6–8 of DQ values. As illustrated in FIG. 4, the odd words are: $D0_o$=0, $D1_o$=1, $D2_o$=1, $D3_o$=0, $D4_o$=1, $D5_o$=0, $D6_o$=0, and $D7_o$=1.

Figure 5:
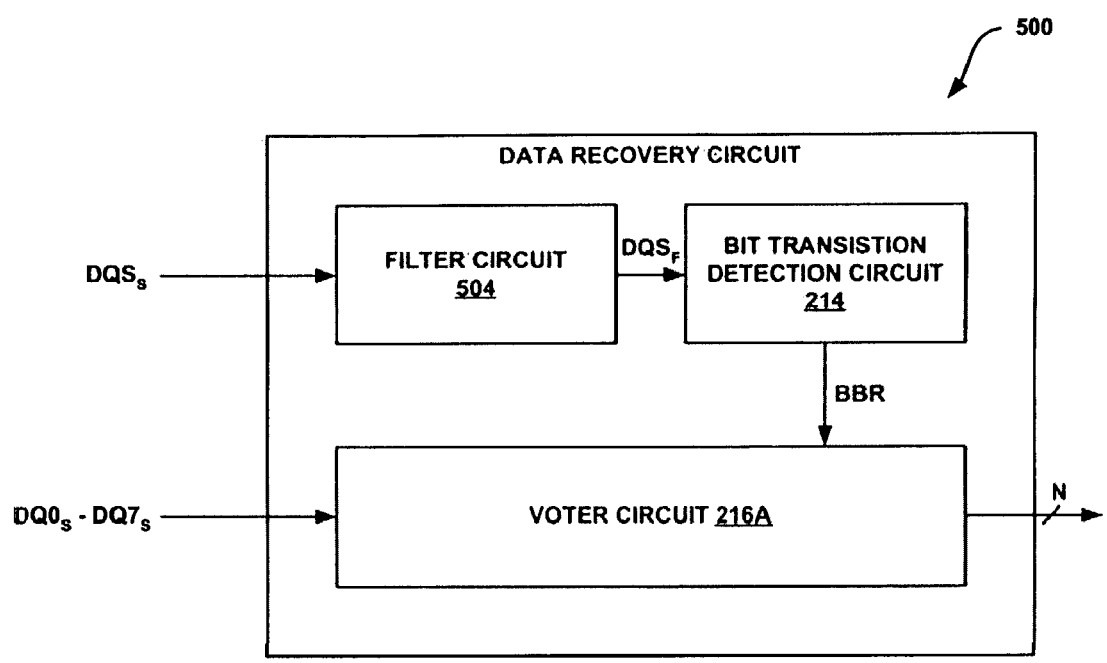
FIG. 5 is a simplified functional block diagram illustrating a second exemplary embodiment for a data recovery circuit that may be employed in the memory controller illustrated in FIG. 2B.

FIG. 5 is a simplified functional block diagram illustrating an alternative embodiment of a data recovery circuit 500 that may be employed in the memory controller 250. The data recovery circuit 500 includes the bit transition detection circuit 214, the voter circuit 216A and a filter circuit 504.

According to an exemplary embodiment illustrated in FIG. 5, the filter circuit 504 filters incoming oversampled DQS, i.e., $DQS_s$, values before the bit transition detection circuit 214 determines bit transitions. For example, the filter circuit 504 may be configured to consider a bit transition as a valid bit transition if two consecutive DQS samples are the same. In such an embodiment, for example, if an oversampled DQS input values are "00101111," then the filter circuit 504 may rule out the third bit position as a bit boundary and may provide a filtered $DQS_F$ value "00001111" to the bit transition detection circuit 214. Then, the bit transition detection circuit 214 may determine a valid bit transition position to be at the fifth bit of the DQS signal.

Figure 6:
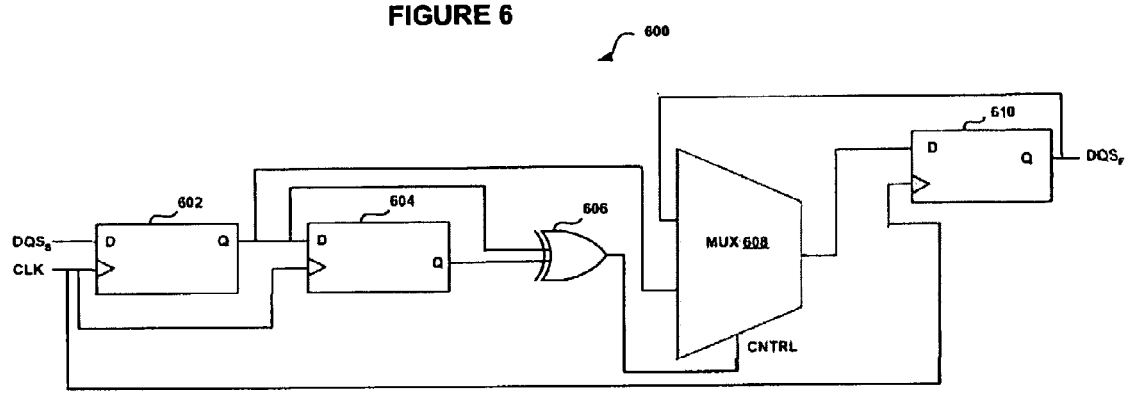
FIG. 6 is a simplified block diagram illustrating an example of a filter circuit that may be used in the exemplary embodiment illustrated in FIG. 5.

FIG. 6 is a block diagram illustrating an embodiment of a filter circuit 600 that may be employed in the exemplary embodiments. The filter circuit includes three D flip-flops 602, 604 and 610, an XOR gate 606, and multiplexor ("MUX") 608. As illustrated in FIG. 6, the D flip-flops 602 and 604 are connected in series, with an input of the first D flip-flop 602 connected to the oversampled DQS signal ("$DQS_S$") and an output of the first D flip-flop 602 connected to an input of the second D flip-flop 604. Further, as illustrated in FIG. 6, a single clock input is connected to the D flip-flops 602, 604, and 610. The outputs of the D flip-flops 602 and 604 are further connected to the 2-input XOR gate 606. Lastly, one input of the MUX 608 is connected to the output of the D flip-flop 602, and the second input is connected to the Q output of D flip-flop 610. MUX's 608 output is connected to the D input of D flip-flop 610. Further, a selection control input of the MUX 608 is connected to the output of the XOR gate 606. A filtered $DQS_F$ signal is output on the Q output of of D flip-flop 610.

According to an exemplary embodiment, if two outputs of the D flip-flops 602 and 604 are the same, then the output of the XOR gate is low, and the output of the first D flip-flop 602 is output from the MUX 608. If two outputs of the D flip-flops have different logic values, then the output of the XOR gate 606 is high, and the MUX 608 maintains the previous output. Therefore, for example, if an input is "0010," then, the output of MUX 608 is "0000." It should be understood that the exemplary embodiments are not limited to the filter circuit 600 illustrated in FIG. 6, and those skilled in the art will appreciate that different or equivalent filter circuits could also be used.

Figure 7:
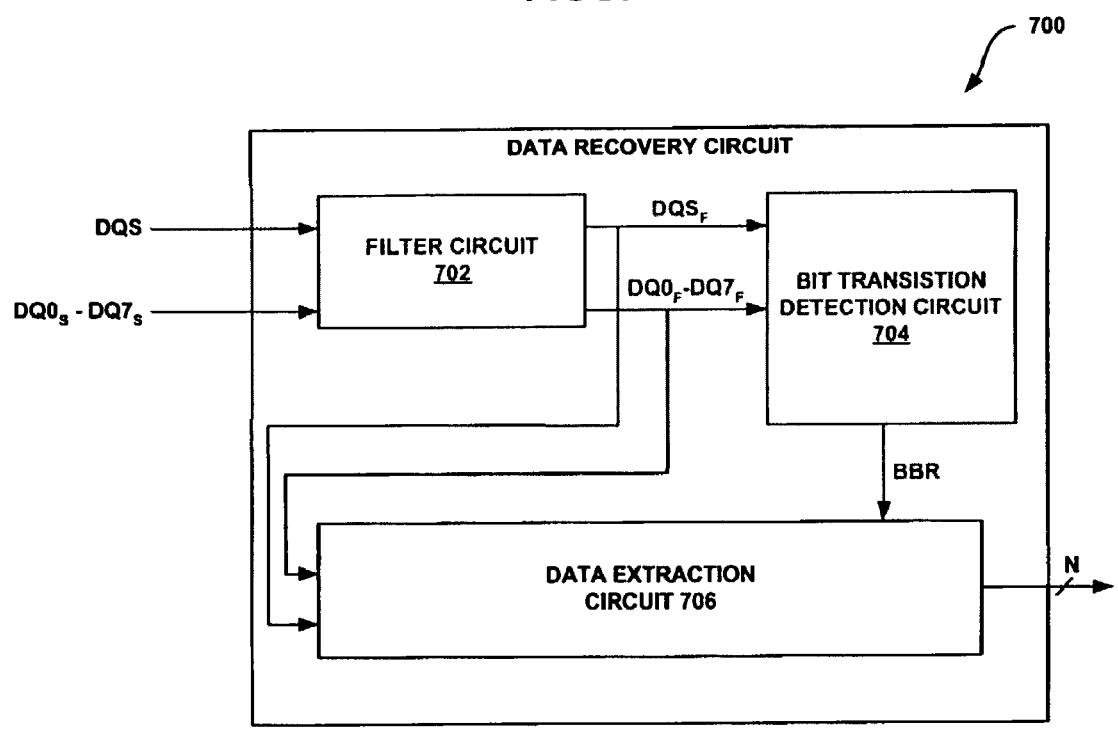
FIG. 7 is a simplified functional block diagram illustrating a third exemplary embodiment for a data recovery circuit that may be employed in the memory controller illustrated in FIG. 2B.

FIG. 7 is a block diagram illustrating another alternative embodiment of a data recovery circuit 700 that may be employed in the memory controller 250 illustrated in FIG. 2B. The data recovery circuit 700 includes a filter circuit 702, a bit transition detection circuit 704, and a data extraction circuit 706. As illustrated in FIG. 7, the filter circuit 702 filters oversampled data values corresponding to $DQ_0$–$DQ_7$ signals as well as oversampled timing signal values corresponding to a DQS signal to eliminate invalid samples. For example, as described in reference to FIG. 5, the filter circuit 702 may be configured to determine if two bits in a row are valid before considering a bit position to be a valid bit transition position. As illustrated in FIG. 7, the filter circuit 702 provides filtered $DQS_F$ values and filtered $DQ0_F$–$DQ7_F$ values to the bit transition detection circuit 704 as well as the data extraction circuit 706. It should be understood that the filter circuit 600 illustrated in FIG. 6 could be used as the filter circuit 702.

According to an exemplary embodiment, the bit transition detection circuit 704 detects bit transition positions in the filtered and unfiltered DQS and DQ signals. For example, assuming that unfiltered oversampled DQS values are "00111100," unfiltered oversampled $DQ_0$ values are "01111000," and an unfiltered $DQ_1$ signal is "10000111," the bit transition detection circuit 604 may determine that $DQ_0$ and $DQ_1$ transition early compared to the DQS signal, thus, detecting the systematic "skew error" introduced by one or more parts of the system. Based on the DQS signal, the bit transition detection circuit 704 may determine that a bit boundary range is 4:6. However, due to the skew error, the bit transition detection circuit 704 may adjust the bit boundary range to be 3:5.

The bit transition detection circuit 704 may then provide the adjusted bit boundary range to the data extraction circuit 706, and the data extraction circuit 706 may take a vote in the range positions 3:5 to determine data words from oversampled data values corresponding to signals $DQ_0$–$DQ_7$. Therefore, in a given example, the data extraction circuit 706 determines an even data word in the $DQ_0$ signal to be "1" and an odd data word corresponding to the $DQ_0$ to be "0." Similarly, in the $DQ_1$, an even data word is "0", and an odd data word is "1". Although each data word in this embodiment consists of a single "bit" or symbol of information, it should be understood that each data word may comprises one or more such "bits" or symbols.

In another alternative embodiment, the bit transition detection circuits 214 or 704 may be configured to store the previous matrix of data that may be used to determine a bit boundary range if a first bit boundary is near the edge of the oversampled timing values. For example, in case of DQS values "00001111", the bit transition detection circuits 214 or 704 may determine that the second bit boundary is the fifth bit position. In the exemplary embodiment, in which bit transition detection circuit 214 or 704 has the available information associated with the previous DQS samples, and the previous samples are, for example, "11", the DQS values combined with the two previous samples are "1100001111", and the bit transition detection circuit may detect the first bit boundary at the first bit position.

The above exemplary embodiments have been described in reference to detecting bit transition positions using oversampled values corresponding to the DQS signal, and using the bit transition positions to determine data words in each set of oversampled values corresponding to DQ signals. It should be understood that the exemplary embodiments are not limited to using the DQS signal as a signal providing bit boundary information to the bit transition detection circuits, as described above. In alternative embodiments that will be described in greater detail below, a bit transition detection circuit may use one or more sets of oversampled values corresponding to data signals to determine a bit boundary range. In such an embodiment, it is assumed that a data signal being used at the transition detection circuit has a logic state transition.

Figure 8:
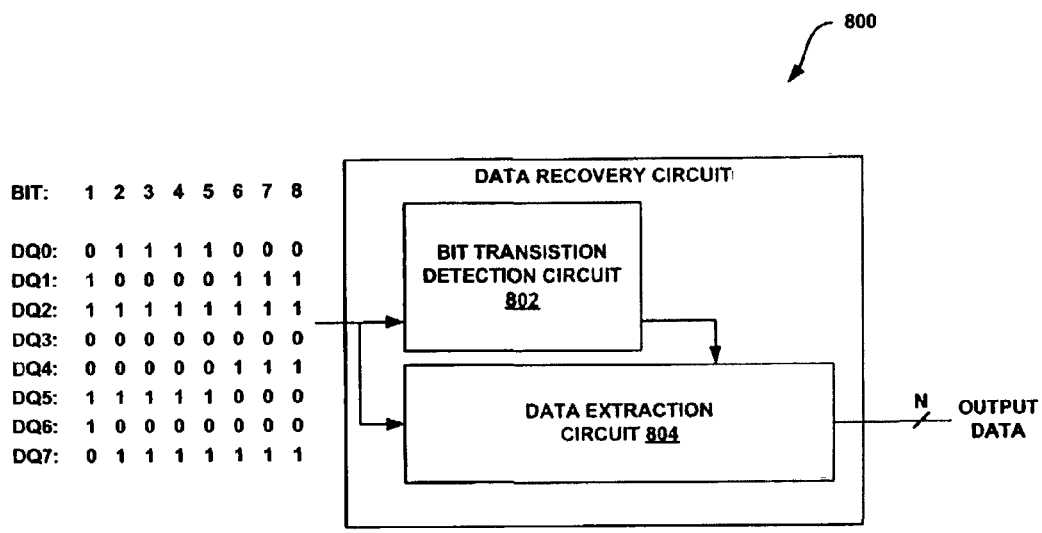
FIG. 8 is a simplified functional block diagram illustrating a fourth exemplary embodiment for a data recovery circuit that may be employed in the memory controller illustrated in FIG. 2B.

FIG. 8 is a block diagram illustrating an embodiment of such a data recovery circuit 800, in which DQ data signal is used for detecting bit boundary positions. The data recovery circuit 800 includes a bit transition detection circuit 802 configured to determine a bit boundary range using DQ data signals, and a data extraction circuit 804 configured to determine output data words in DQ data signals based on the bit boundary range provided by the bit transition detection circuit 802.

The eight data signals ($DQ_0$–$DQ_7$) that are input to the bit transition detection circuit 802 and the data extraction circuit 804 are the same data signals as illustrated in FIG. 4. Referring back to FIG. 4, in which the bit transition detection circuit 214 used the DQS signal to determine the bit transition positions, the bit boundary range determined by the bit transition detection circuit 214 was 3:5. Referring now to FIG. 8, the bit transition detection circuit 802 determines a bit boundary range using data signals that include logic state bit transitions, such as data signals $DQ_0$ or data signal $DQ_1$. Examining the data signal $DQ_0$ or $DQ_1$, bit transition detection circuit 802 may detect a bit transition at bits 2 and 6 in the $DQ_0$ or $DQ_1$ signal, thus, determining the bit boundary range 3:5, as in the embodiment illustrated in FIG. 4. The bit transition circuit 802 may then provide the bit boundary range 3:5 to the data extraction circuit 804 that, subsequently, may use the bit boundary range 3:5 to detect data words in each of the DQ signals.

Other techniques for bit boundary range detection may alternatively be used. For example, another way of doing bit-boundary range detection across a byte is to have the memory device or other sending device transmit a known or preset pattern. The receiver could then oversample the data and hold it while another circuit searched for the bit-boundary setting which recovers the known pattern. In this example, another circuit would adjust the "BBR" value until the output data matched the known, pre-set pattern.

Further, as is known in the art, some memory systems may use the Series Stub Terminated Logic ("SSTL") signaling. In such systems, an incoming data bit that is received at a memory controller from a memory device (such as a DRAM device) has three distinct voltage (signal) levels, including a "logic 0" signal level, a "logic 1" signal level, and an idle signal level. According to an exemplary embodiment, in a memory system using SSTL, a bit transition detection circuit may determine a bit boundary range by detecting a transition from an idle state to a non-idle (active) state, "0" or "1" using a DQ signal or a DQS signal.

A bit transition detection circuit may use a voltage comparator to determine when the incoming data signal transitions from the idle state to the non-idle state, such as logic 0 or 1. For example, if "j" represents the idle voltage state, and a first $DQ_0$ signal is "jjj00000", a comparator at a bit transition detection circuit may determine a signal transition from the idle state to a logic 0 state at a bit position 4. Next, the bit transition detection circuit may be configured to add "L" cycles to a bit transition position (bit position 4, in this example) and use a preset value of "M" to define a boundary range. For example, a transition detection circuit may be pre-programmed with values for "L" and "M" and, in the exemplary embodiment, the value of L may be set to one cycle and the value of "M" may be set to three cycles, for example. Thus, referring to the given example of "jjj00000" with L=1 and M=3, the boundary range would be 5:7. It should be understood that different values could also be used.

FIG. 9 is a control flow diagram illustrating an embodiment of a process 900 performed by a memory controller for reading data from a memory device according to exemplary embodiments of the present invention. At step 902, a memory controller receives a plurality of input signals from a memory device. The memory device may be a DDR memory device in a multi-rank memory system. Further, the memory device may transmit N data signals to the memory controller (typically 8 or 32). In addition to data signals, the memory controller may also receive from the memory device a timing reference signal (or a data output synchronize signal) associated with the input data signals.

At step 904, the memory controller generates a plurality of oversampled input values for each of the plurality of input signals received from the memory device. In one embodiment, the memory controller may include an input sampler circuit such as one or more edge triggered data samplers that are driven by a high-speed clock signal having a clock frequency that is a multiple of the clock that is used at the memory device.

At step 906, the memory controller selects one of the sets of oversampled input values to be used for determining a bit boundary range. According to an exemplary embodiment, the set of oversampled input values selected by the memory controller has at least one logic state transition, such as a logic transition from a logic state such as 1 to 0, for example. According to one embodiment, the memory controller may select a set of oversampled values corresponding to a timing reference signal or a data signal.

At step 908, the memory controller determines a bit boundary range using the selected set of oversampled input values. In one embodiment, the memory controller determines the bit boundary range using the oversampled timing reference signal. Alternatively, the memory controller determines the bit boundary range using one or more of sets of oversampled input data values that include bit transitions. The memory controller, as explained in reference to the preceding figures, may first determine bit transition positions that are then used for determining the bit boundary range.

At step 910, the memory controller determines data words from the oversampled input data values corresponding to each input data signal. According to an exemplary embodiment, to do that, the memory controller may use the bit boundary range. For example, in the case of a DDR memory device, the memory controller may determine an even data word and an odd data word for each set of oversampled input data values.

At step 912, the memory controller outputs the data words, and method 900 terminates.

While the invention has been described in connection with a number of exemplary embodiments, the foregoing is not intended to limit the scope of the invention to a particular form, circuit arrangement, or semiconductor topology. To the contrary, the invention is intended to include such alternatives, modifications and variations as may be apparent to those skilled in the art upon reading the foregoing detailed description.

Further, it should be understood that the illustrated embodiments are exemplary only and can be practiced with hardware, software, or a combination of hardware and software. For example, the exemplary embodiments of controller described hereinbefore may be programmed with a set of instructions to perform the methods for data acquisition described hereinbefore. Also, although the exemplary embodiments described herein make reference to memory devices, memory controllers and memory systems, the present invention is not limited to memory systems. The present invention can be practiced in any electronic system having two circuits which communicate with each other. It also be understood that although the illustrated embodiments are described with refer to binary systems having a high and low logic states, the present invention may also be practiced with systems employing multi-leveling signaling. It should also be understood that the present invention may be implemented in optical, as well as electrical, systems.

What is claimed:

1. A method for data acquisition in a memory system, the method comprising:
   receiving, at a memory controller, a plurality of input signals;
   generating a series of oversampled input values for each of the plurality of input signals;
   selecting one of the series, wherein the selected series has at least one logic transition;
   determining a bit boundary range using the selected series; and
   determining a plurality of data words using the bit boundary range, wherein each of the data words corresponds to a respective one of the plurality of input signals.

2. The method of claim 1, wherein the receiving step comprises receiving, at a second electronic circuit, a plurality of input signals from a first electronic circuit.

3. The method of claim 2, wherein the generating step comprises generating the series of oversampled input values at the second electronic circuit.

4. The method of claim 3, wherein the first electronic circuit is disposed on a first semiconductor chip.

5. The method of claim 4, wherein the selected series of oversampled input values is used to generate a filtered series of oversampled input values; and
   the filtered series of oversampled input values is used to determine the bit boundary range.

6. The method of claim 3, wherein the first electronic circuit is disposed on the memory controller.

7. The method of claim 6, wherein the first electronic circuit is disposed in a memory device.

8. The method of claim 7, wherein the memory device comprises a double data rate (DDR) memory device, and the step of determining data words from the series of oversampled input values corresponding to each of the plurality of input signals comprises determining an even data word and an odd data word for each of the plurality of input signals.

9. The method of claim 3, wherein the second electronic circuit is configured to use three signal levels and wherein one of the three signal levels is an idle signal level, and the step of determining a bit boundary range comprises:
   determining a signal transition position from an idle state to a non-idle state in the selected series of oversampled input values; and
   adding a predetermined number of clock cycles to the signal transition position to determine the bit boundary range.

10. The method of claim 2, wherein the first electronic circuit is disposed on a first semiconductor chip.

11. The method of claim 1, wherein the plurality of input signals comprises a timing reference signal, and the step of selecting a series of oversampled input values comprises selecting a series of oversampled input values to determine the bit boundary range.

12. The method of claim 1, wherein the plurality of input signals comprises a timing reference signal, and the step of selecting a series of oversampled input values comprises selecting a series of oversampled input values corresponding to the timing reference signal.

13. The method of claim 1, wherein determining a bit boundary range comprises:
   determining at least one bit transition position in the selected series of oversampled input values; and
   using the at least one bit transition position to determine the bit boundary range.

14. The method of claim 1, wherein the selected series of oversampled input values comprises a preset pattern of known input values.

15. The method of claim 1, wherein the step of determining a bit boundary range comprises adjusting a bit boundary range value until an output data pattern matches the preset pattern.

16. The method of claim 1, further comprising outputting the plurality of data words.

17. The method of claim 1, further comprising:
   before determining the data words, determining a first signal transition position in at least one series of oversampled input values corresponding to at least two of the plurality of input signals;
   determining if the first signal transition position in the at least one series of oversampled input values occurs before a first signal transition associated with the bit boundary range; and if so,
   adjusting the bit boundary range based on the signal transition position associated with the at least one series of the oversampled input values and further based on the first signal transition associated with the boundary range.

18. A method for data acquisition in a memory system, the method comprising:
   receiving, at a memory controller, a plurality of input data signals from a first electronic circuit;
   receiving, at the memory controller, a timing reference signal from the first electronic circuit, wherein the timing reference signal is associated with the plurality of input signals;
   generating a series of oversampled input data values for each of the plurality of input data signals;
   generating a series of oversampled timing reference values for the timing reference signal;

determining a first bit transition position and a second bit transition position in the series of oversampled timing reference values;

determining a bit boundary range using the first bit transition position and the second bit transition position; and determining at least one data word from each series of oversampled input data values generated for each of the plurality of input data signals using the bit boundary range.

19. The method of claim 18, wherein the first electronic circuit is a memory device comprising a double data rate (DDR) memory device, and wherein the determining at least one data word from each series of oversampled input data values comprises determining an even data word and an odd data word for each series of oversampled input data values.

20. The method of claim 18, further comprising:
filtering the series of oversampled timing reference values before determining the first bit transition position and the second bit transition position to generate a series of filtered oversampled timing reference values.

21. The method of claim 20, wherein the step of filtering comprises disregarding a bit transition position as a valid bit transition position if a second bit following a first bit considered as a bit transition has a different signal level than the first bit.

22. The method of claim 18, further comprising storing a plurality of preceding oversampled input values and a preceding oversampled timing reference values; and
determining if the first bit transition position is an edge bit transition position; and, if so,
using the preceding oversampled timing reference values to determine the first bit transition position.

23. A first electronic circuit for reading data from a second electronic circuit, the first electronic circuit comprising:
first circuit means disposed on a memory controller for receiving a plurality of input signals from the second electronic circuit, the first circuit means being configured to generate a series of oversampled input values for each of the plurality of input signals;
second circuit means for determining a bit boundary range using at least one series of oversampled input values; and
third circuit means for receiving the bit boundary range from the second circuit means, and determining at least one data word in each series of the oversampled input values, wherein the third circuit means determines the at least one data word using the bit boundary range.

24. The first electronic circuit of claim 23, wherein the second circuit means is configured to select the at least one series of oversampled input values and determine the bit boundary range based on signal level transition positions in the selected series of oversampled input values.

25. The first electronic circuit of claim 24, further comprising:
fourth circuit means configured to filter the selected series of oversampled input values to generate a series of filtered oversampled input values, wherein the second circuit means is configured to determine the signal transition positions using the series of filtered oversampled input values.

26. The first electronic circuit of claim 25, wherein the fourth circuit means is further configured to filter invalid bit transition positions, and wherein the fourth circuit means is configured to consider the bit transition as invalid if a bit following a bit considered as a bit transition has a different signal level.

27. The first electronic circuit of claim 23, wherein the plurality of input signals comprises a timing reference signal, and the second circuit means is configured to determine the bit boundary range based on signal transition positions in a series of oversampled timing reference values.

28. The first electronic circuit of claim 23, wherein the first electronic circuit comprises a memory controller, and the second electronic circuit comprises at least one memory device.

29. The first electronic circuit of claim 28, wherein the at least one memory device comprises a double data rate memory device.

30. The first electronic circuit of claim 23, wherein the first electronic circuit comprises clock generation means configured to generate a clock signal for use in generation of the series of oversampled values for each of the plurality of input signals.

31. The first electronic circuit of claim 30, wherein the clock signal comprises a high-speed clock signal, and the first electronic circuit further comprises:
divider circuit means configured to receive the high-speed clock signal from the clock generation means, divide the high-speed clock signal by an integer and provide a lower-speed clock signal to the second electronic circuit.

32. The first electronic circuit of claim 30, wherein the clock generation means is configured to generate a multi-phase clock signal for use in generation of the series of oversampled values for each of the plurality of input signals.

33. The first electronic circuit of claim 23, wherein the second electronic circuit comprises a first memory device in a multi-rank memory system.

34. A first electronic circuit for reading data from a second electronic circuit, the first electronic circuit comprising:
an input sampler circuit configured on a memory controller to receive a plurality of input signals from the second electronic circuit, wherein the input sampler circuit is configured to generate a series of oversampled input values for each of the plurality of input signals, and wherein the input sampler circuit is further configured to output each series of oversampled input values; and
a data recovery circuit configured on the memory controller to receive each of the series of oversampled input values, the data recovery circuit comprising:
a bit transition detection circuit configured to determine a bit boundary range using at least one of the series, wherein the bit boundary range is determined based on signal logic state transition positions in the selected series; and
a data extraction circuit configured to receive the bit boundary range from the bit transition detection circuit, and further configured to receive each series of oversampled input values, wherein the data extraction circuit is further configured to determine data words from each series of oversampled input values using the bit boundary range.

35. The first electronic circuit of claim 34, further comprising:
a clock generation circuit configured to generate a high-speed clock signal, and provide the high-speed clock signal to the input sampler circuit that uses the high-speed clock signal to generate each series of oversampled input values, wherein the high-speed clock signal is further input to a divider configured to generate a second clock signal that is output to the second electronic circuit, wherein the second clock signal is a lower-speed clock signal compared to the high-speed clock signal.

36. The first electronic circuit of claim 34, further comprising:
a clock generation circuit configured to generate multi-phase clock signals, and provide the multi-phase clock signals to the input sampler circuit that uses the multi-phase clock signals to generate each series of oversampled input values, wherein the multi-phase clock signals are further input to a multiplexor configured to select one clock signal from the multi-phase clock signals that is output to the memory device.

37. The first electronic circuit of claim 34, further comprising:
a filter circuit configured to filter the at least one series of oversampled input values before determining the bit boundary range at the bit transition detection circuit, wherein the filter circuit is configured to filter invalid bit transitions, and wherein the filter circuit is configured to detect an invalid bit transition if a bit following a bit considered as a bit transition has a different signal level.

38. The first electronic circuit of claim 34, wherein the plurality of input signals comprises a timing reference signal, and wherein the bit transition detection circuit is configured to use a series of oversampled timing reference values corresponding to the timing reference signal to determine the bit boundary range.

39. The first electronic circuit of claim 34, wherein the second electronic circuit comprises a double data rate memory device in a multi-rank memory system, and the voter circuit is configured to determine an even data word and an odd data word for each input data signal received at the first electronic circuit from the double data rate memory device.

40. The first electronic circuit of claim 34, wherein the data extraction circuit is a voter circuit.

41. A first electronic circuit for reading data received from a second electronic circuit, the first electronic circuit comprising:
a bit transition detection circuit configured on a memory controller to receive at least one series of oversampled input values generated based on at least one input signal received from the second electronic circuit, the bit transition detection circuit further configured to determine a bit boundary range using the at least one series of oversampled input values and further based on signal logic state transition positions in the at least one series of oversampled input values; and
a data extraction circuit configured on the memory controller to receive the bit boundary range from the bit transition detection circuit and further configured to receive the at least one series of oversampled input values, the data extraction circuit further configured to use the bit boundary range to determine at least one data word from the at least one series of oversampled input values.

42. The first electronic circuit of claim 41, wherein the at least one series of oversampled input values comprises a series of timing reference oversampled values and at least one series of oversampled data values corresponding to at least one data signal, and wherein the series of oversampled input values selected at the bit transition detection circuit comprises the series of timing reference oversampled values.

43. The first electronic circuit of claim 41, wherein the at least one series of oversampled input values selected at the bit transition detection circuit corresponds to the at least one series of oversampled data values.

44. The first electronic circuit of claim 41, further comprising:
a filter circuit configured to filter the at least one series of oversampled input values before determining the bit boundary range at the bit transition detection circuit, wherein the filter circuit is configured to filter invalid bit transitions.

45. The first electronic circuit of claim 44, wherein the filter circuit is further configured to filter the at least one series of oversampled input values and provide at least one series of filtered oversampled input values to the bit transition circuit that is configured to use the at least one series of filtered oversampled input values to determine the bit boundary range, the filter circuit further configured to provide the at least one series of filtered oversampled input values to the data extraction circuit that is then configured to determine the data words using the at least one series of filtered oversampled input values.

46. The first electronic circuit of claim 41, wherein the first electronic circuit is included in a double data rate memory device in a multi-rank memory system, and wherein the data extraction circuit is configured to determine an even data word and an odd data word from each series of oversampled input values.

47. The first electronic circuit of claim 41, wherein the data extraction circuit is a voter circuit.

48. A memory controller for data acquisition in a multi-rank memory system, the memory controller comprising:
a clock divider circuit configured on the memory controller to receive a high-speed clock signal and provide a lower-speed clock signal to a plurality of memory devices in the multi-rank memory system; and
a data recovery circuit configured on the memory controller to receive a plurality of oversampled input signals generated based on a plurality of input signals received from one of the plurality of memory devices in the multi-rank memory system, the data recovery circuit configured to determine a bit boundary range using at least one of the plurality of oversampled input signals and apply the bit boundary range to the plurality of oversampled input signals to determine data words from the plurality of oversampled input signals.

49. An electronic circuit programmed with a set of instructions to perform the method of:
selecting an oversampled input signal having at least one transition, wherein the oversampled input signal is selected from a plurality of oversampled input signals received at a memory controller from a second electronic circuit;
determining a bit boundary range using the selected oversampled input signal; and
determining a plurality of data words from the plurality of oversampled input signals using the bit boundary range.

50. The electronic circuit of claim 49, wherein the second electronic circuit comprises a memory devices, and wherein the memory controller is used in a multi-rank memory system, and the memory device is one of a plurality of memory devices in the multi-rank memory system.

51. A method for data acquisition in a memory system, the method comprising:

receiving, at a memory controller, a plurality of input signals from a first electronic circuit disposed in a memory device;

generating, at the memory controller, a series of oversampled input values for each of the plurality of input signals;

selecting one of the series, wherein the selected series has at least one logic transition;

determining a bit boundary range using the selected series; and determining a plurality of data words using the bit boundary range, wherein each of the data words corresponds to a respective one of the plurality of input signals.

52. The method of claim 51, wherein the memory device is disposed on the memory controller.

* * * * *